United States Patent [19]

Inglis et al.

[11] Patent Number: 5,781,558
[45] Date of Patent: Jul. 14, 1998

[54] DIAGNOSTIC MEMORY ACCESS

[75] Inventors: Graham Donald Inglis, Altrincham; Barry Gordon Radley, Glossop, both of England

[73] Assignee: International Computers Limited, London, United Kingdom

[21] Appl. No.: 854,976

[22] Filed: May 13, 1997

[30] Foreign Application Priority Data

Aug. 14, 1996 [GB] United Kingdom ............... 9617033

[51] Int. Cl.⁶ ........................................... G06F 11/00
[52] U.S. Cl. ............................... 371/21.1; 371/22.3
[58] Field of Search ........................ 371/21.1, 22.1, 371/22.3, 22.5, 22.6; 395/183.06; 364/488, 489

[56] References Cited

U.S. PATENT DOCUMENTS 5,621,651 4/1997 Swoboda ........................... 364/489
5,708,773 1/1998 Jeppesen, III et al. ............. 395/183

Primary Examiner—Vincent P. Canney
Attorney, Agent, or Firm—Lee, Mann, Smith, McWilliams, Sweeney & Ohlson

[57] ABSTRACT

A data processing system has at least one processing module containing one or more blocks of memory, having control registers which are accessible via a diagnostic interface, and a clock module which distributes system clocks to the processing module(s), the operation of which is controllable using a similar diagnostic interface. One of the possible actions in the clock module is the generation of a single-shot clock pulse. A diagnostic control unit is connected to the separate diagnostic interfaces of the processing module(s) and the clock module, and is capable of simultaneously controlling the two diagnostic interfaces in such a way that a single-shot clock pulse can be synchronized with the diagnostic access to a processing module to effect the loading or dumping of a block of memory line by line.

9 Claims, 3 Drawing Sheets

DIAGNOSTIC MEMORY ACCESS

BACKGROUND TO THE INVENTION

This invention relates to diagnostic facilities for data processing systems, and more specifically is concerned with a technique for obtaining diagnostic access to the contents of a memory, such as a random access memory (RAM).

It is well known to provide a data processing system with diagnostic scan access facilities. These facilities permit access to internal logic circuits and registers within the system so that, for example, test patterns can be shifted into selected registers, and result data can be shifted out for comparison with the expected results. The standard JTAG (Joint Test Action Group) interface, as defined in IEEE 1149.1 is one known interface for diagnostic access.

However, conventional scan facilities do not provide efficient and rapid access to internal memories, such as random access memories (RAMs) or register files. For example, it may be required to load data into a memory during initialisation, or to dump the contents of a memory after a crash, and this can take an excessive time with conventional techniques. The object of the present invention is to provide improved facilities for diagnostic access to such memories.

SUMMARY OF THE INVENTION

According to the invention there is provided a data processing system comprising:
(a) at least one processing module containing at least one block of memory, a plurality of internal registers, and a diagnostic interface allowing diagnostic access to said internal registers;
(b) a clock module for distributing system clock signals to each said processing module, and having a diagnostic interface by way of which the operation of said clock module can be controlled to selectively generate a single-shot clock pulse; and
(c) a diagnostic control unit connected to said diagnostic interfaces, said diagnostic control unit being operable to control said diagnostic interfaces to synchronise said single-shot clock pulse from the clock module with a diagnostic access in said processing module, to thereby effect line-by-line loading or dumping of said block of memory.

DESCRIPTION OF AN EMBODIMENT OF THE INVENTION

One embodiment of the invention will now be described by way of example with reference to the accompanying drawings.

Figure 1:
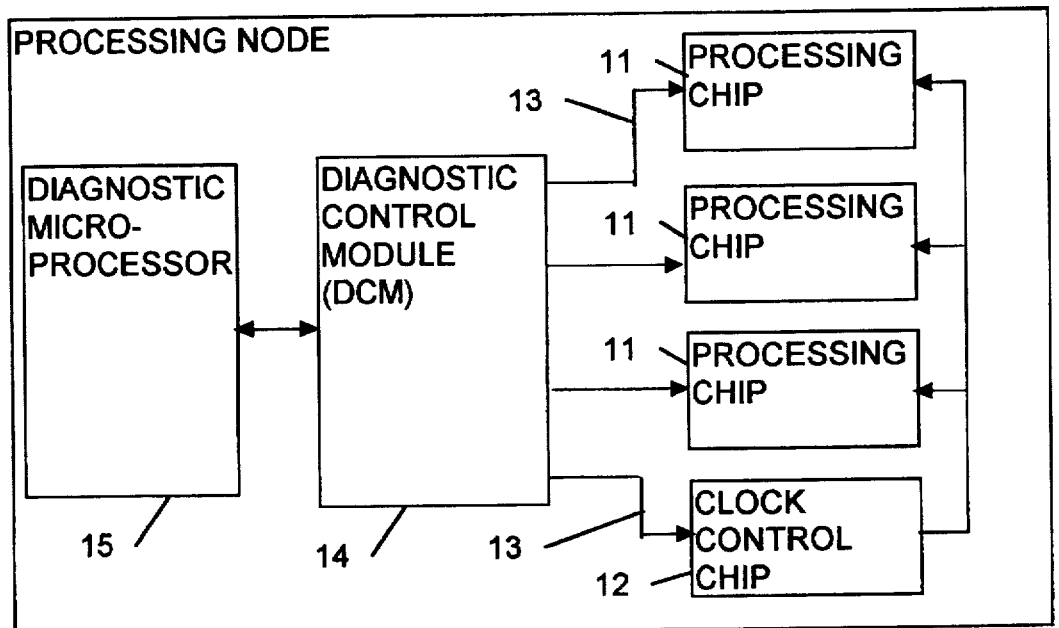
FIG. 1 is a block diagram showing a data processing node embodying the invention.

Referring to FIG. 1, a data processing node 10 includes a number of processing chips 11, which provide the main data processing functionality of the node. These chips may for example include processor chips, communications chips, and so on. The exact nature of these chips forms no part of the present invention. The node also includes a clock control chip 12, which provides a system clock signal to all the processing chips 11.

Each of the processing chips 11 and the clock control chip 12 has a JTAG interface 13, allowing diagnostic access to the internal logic circuits and registers within the chip. The JTAG interface is a 4-wire serial interface, which carries control, clock, data in and data out signals.

The node also includes a diagnostic control module (DCM) 14, which is connected to the JTAG interfaces 13 of the chips 11,12. The DCM is in turn controlled by commands from a diagnostic microprocessor 15. In operation, the DCM can select any one of the chips 11 as a target chip, and then perform diagnostic operations on that chip. These diagnostic operations may include, for example, serially shifting initialisation data into the internal registers of the target chip, monitoring the state of the chip during normal system operation, and shifting data out of the chip, following a crash, to aid fault diagnosis.

Figure 2:
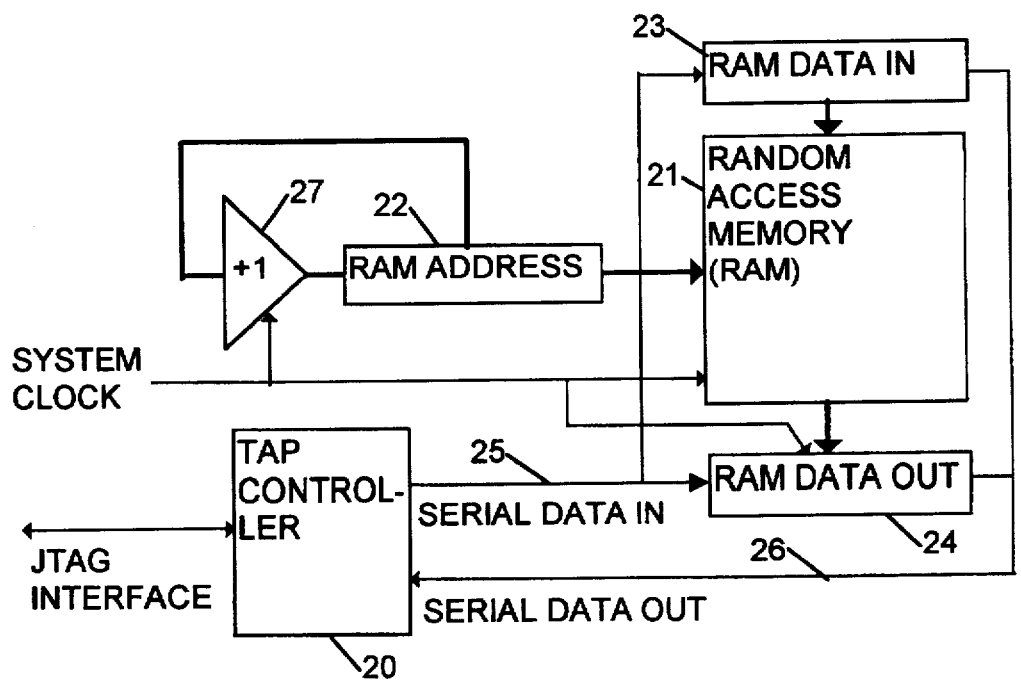
FIG. 2 is a block diagram showing a RAM and diagnostic circuits within a processing chip.

FIG. 2 shows one of the processing chips 11 in more detail. In accordance with the JTAG standard, each chip 11 includes a circuit referred to as a TAP controller 20, which controls the diagnostic functions within the chip. The TAP controller is a state machine, which is stepped from one state to the next by the clock signal from the JTAG interface. The control signal from the JTAG interface steers the TAP controller between states where there are two possible next states. The TAP controller includes an instruction register (IR), the contents of which are used to select various Data Registers (DRs) and/or perform control operations. Some DRs are mandatory in the JTAG standard, but many decodes are available for the designer to use, and Data Registers which are defined in this way are known as User Registers (URs). In addition to selecting Data Registers, the user-defined IR decodes can also be used to configure internal logic. For example, internal multiplexors could be steered by an IR decode to select various sources for a register input, or a chip output. In addition, the TAP controller produces pulses as it goes through some of the internal states, as will be explained below. These IR decodes which perform control actions, rather than selecting a Data Register, are known as User Functions. Another way of using the TAP controller is to use one User Register as a mode control which can for example steer internal multiplexors. In the chip 11, there is such a mode control User Register, which has a Read RAM mode and a Write RAM mode, in addition to various other modes which form no part of the present invention.

The chip 11 includes at least one RAM 21, having a RAM address register 22, a RAM data input register 23, and a RAM data output register 24. Registers 22, 23 and 24 have respective parallel connections to the address input, the data input, and the data output of the RAM. Registers 23, 24 are also configured as user registers, which means that they are connected to the TAP controller by way of a serial data input line 25 and a serial data output line 26, so as to allow test data to be written serially into either of these registers, and to allow result data to be shifted serially out.

The address register 22 has an incrementor circuit 27 associated with it. Normally, this incrementor circuit is disabled. However, when the Read RAM or Write RAM mode is selected, the incrementor circuit is enabled so that it increments the RAM address register by one at each system clock pulse. When the Read RAM mode is enabled, each system clock pulse also loads the contents of the currently addressed line of the RAM into the RAM data output register 24. Similarly, when the Write RAM mode is enabled, each system clock pulse loads the RAM data input register 23 into the currently addressed line of the RAM.

Figure 3:
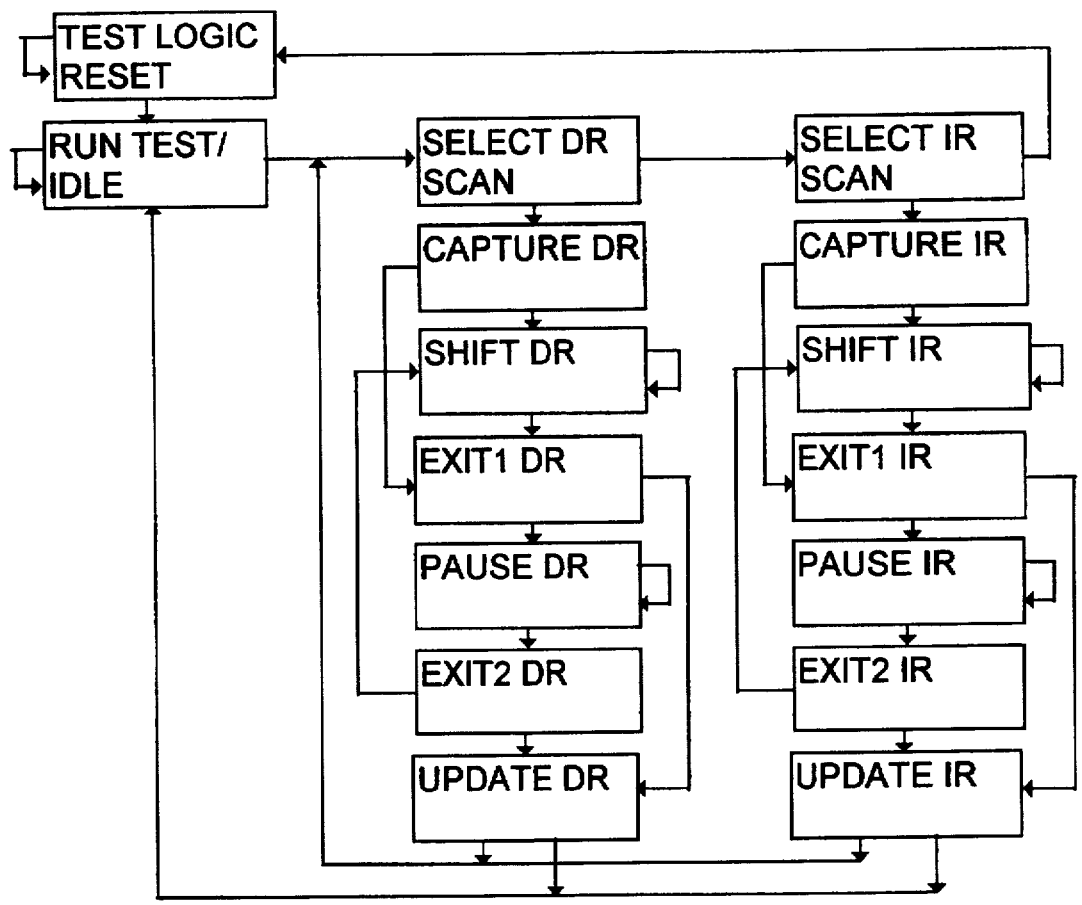
FIG. 3 is a state transition diagram of a TAP controller circuit within a processing chip.

FIG. 3 is a state transition diagram of the TAP controller 20. The states are as defined in IEEE 1149.1 and so need not be described in detail. Briefly, however, the Capture IR state causes data to be loaded in parallel into the instruction register; the Shift IR state causes the instruction register to be shifted, so as to input data serially from the serial data input path and/or to output data serially on to the serial data output path; and the update IR state causes a parallel unload of the new instruction register value into a slave register which is actually used by the IR decoding logic (since it is not useful to have the decoder operating while the data is being shifted through the instruction register). The Capture DR, Shift DR and Update DR states perform similar operations on the selected data register, although it should be noted that the parallel load/unload functions are optional. The Run-Test/Idle state causes the value in the instruction register to be maintained, but no shifting or loading takes place.

Figure 4:
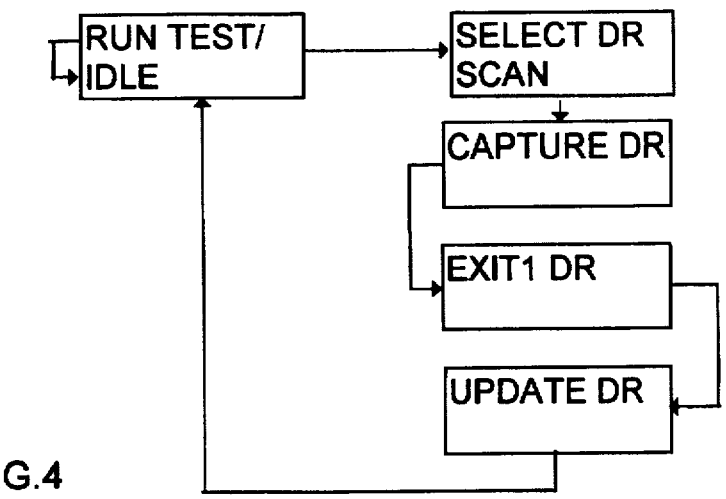
FIG. 4 is a state transition diagram of a TAP controller circuit within a clock control chip.

The clock control chip 12 includes a similar TAP controller to that described above. FIG. 4 shows the state transition diagram for the TAP controller in the clock control chip. There is a User Function in this chip which is defined such that whenever the TAP controller passes through its Update DR state, it generates a single system clock pulse. This latter feature, which is not part of the standard TAP controller design, provides the clock control chip with a "one-shot" clock facility, the use of which will be described later.

Figure 5:
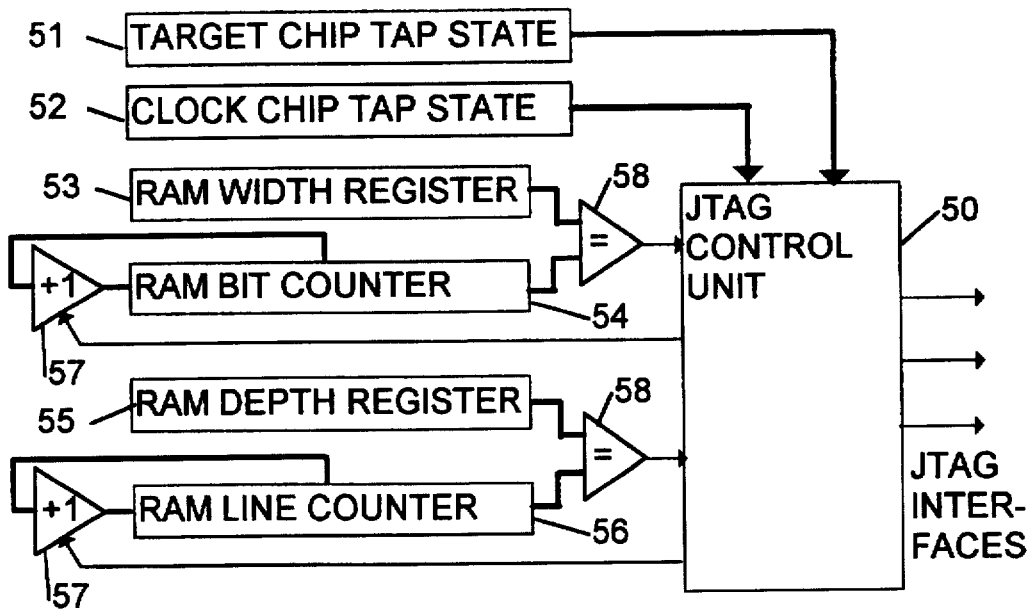
FIG. 5 is a block diagram showing a diagnostic control module (DCM) in more detail.

FIG. 5 shows the DCM in more detail. The DCM includes a JTAG control unit 50 which has connections to the JTAG interfaces 13 of each of the chips 11,12. The JTAG control unit uses the following registers:

Target chip TAP state register 51—stores the current state of the TAP circuit in the target chip.

Clock control TAP state register 52—stores the current state of the TAP circuit in the clock control chip 12.

RAM width register 53—indicates the number bits in each line of the RAM to be accessed in the target chip.

RAM bit counter 54—counts the number of bits that have been shifted into the RAM data input register, or shifted out of the RAM data output register in the target chip.

RAM depth register 55—indicates the total number of lines in the RAM.

RAM line counter 56—counts the number of lines that have been written into the RAM from the RAM data input register, or read from the RAM into the RAM data output register.

The RAM bit counter 54 and the RAM line counter 56 each have an incrementor circuit 57 for incrementing their contents. The counters 54, 56 also have respective comparator circuits 58 for detecting equality between the contents of the counters and the registers 53, 55.

Figure 6:
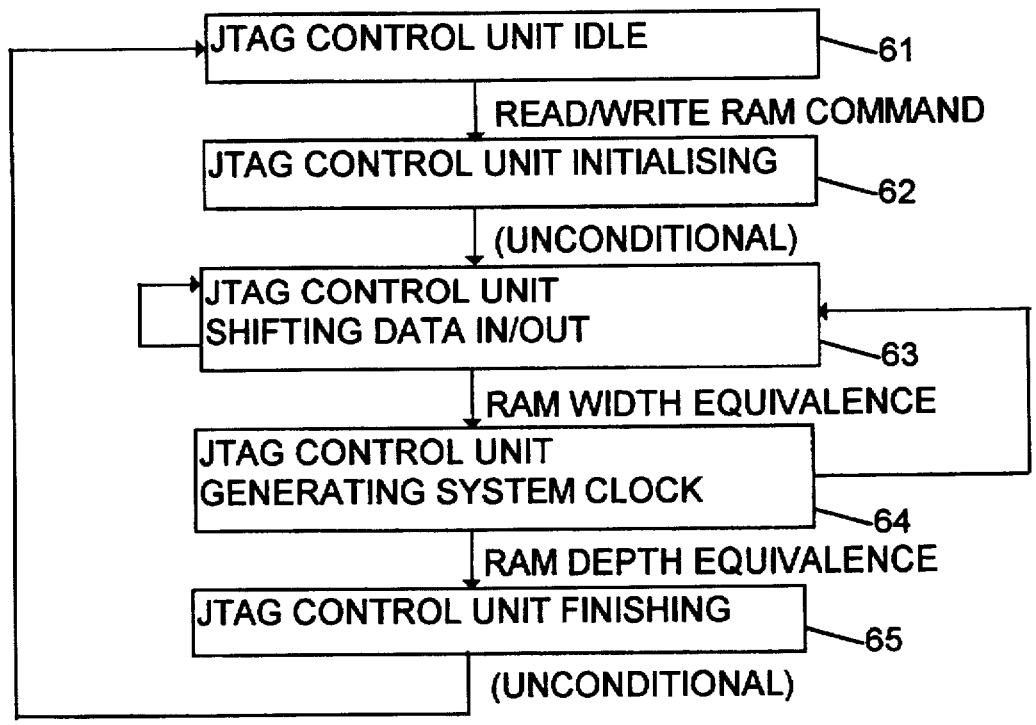
FIG. 6 is a state transition diagram showing the operation of the DCM for diagnostic access to a RAM within a processing chip.

The operation of the DCM when it receives a Read RAM or Write RAM command from the diagnostic microprocessor, instructing it to access the contents of a RAM in a specified target chip, will now be described with reference to FIG. 6.

Before the main sequence, previous commands from the diagnostic microprocessor will have selected either the Read RAM mode or the Write RAM mode in the target chip, and then loaded the IR in the target chip with the "Ram Data In" or "Ram Data Out" User Register as appropriate. The instruction register of the clock control chip will also have been loaded with the User Function which causes it to send a single shot system clock in the Update DR state as described above.

(State 61—JTAG Control Idle). In this state, the target chip and the clock control chip are both set in the Run Test/Idle state. When a Read RAM or Write RAM command is received, the DCM goes to State 62.

(State 62—JTAG Control Unit Initialising). In this state, the DCM sends signals to the target chip, over its JTAG interface, to advance the TAP controller in the target chip through its Select DR Scan state into its Capture DR state. At the same time, the DCM initialises the RAM depth register 55 with the number of lines in the RAM, and the RAM width register 53 with the number of bits per line. The counters 54, 56 are set to zero. The DCM then goes to State 63.

(State 63—JTAG Control Unit Shifting Data In/Out). In this state, the DCM advances the TAP controller in the target chip into its Shift DR state, so as to shift out one bit of data from the RAM data output register on to the serial data output line 26, or to shift one bit of data from the serial data input line 25 into the RAM data input register 23. At the same time, the DCM increments the RAM bit counter register 54. If the RAM bit counter is now equal to the RAM width register (i.e. all the required bits of the register 23/24 have now been shifted), the DCM resets the RAM bit counter to zero and proceeds to State 64 below; otherwise it remains in State 63, so as to shift the next bit.

(State 64—JTAG Control Unit Generating System Clock). In this state, the DCM advances the TAP controller in the target chip through the following sequence of states: Exit1 DR, Pause DR, Pause DR (for a second time), and Exit2 DR. At the same time, the DCM advances the TAP controller in the clock control chip through the following sequence of states: Select DR Scan, Capture DR, Exit1 DR, and Update DR. As mentioned above, when the TAP controller in the clock control chip passes through the Update DR state, it causes the clock control chip to generate a one-shot system clock pulse. This pulse causes data to be written into the currently addressed line of the RAM from the RAM Data Input register 23, or to be read from the currently addressed line into the RAM Data Output register 24. At the same time, the DCM increments the RAM line counter 56, so as to point to the next RAM line. If the RAM Line counter is now equal to the RAM Depth register (i.e. all the lines of the RAM have now been accessed), the DCM resets the RAM line counter to zero and proceeds to State 65 below; otherwise it returns to State 63 above, so as to begin shifting data into or out of the next RAM line.

(State 65—JTAG Control Unit Finishing). In this state, the DCM advances the TAP controller in the target chip into the Update DR state, and advances the TAP controller in the clock control chip into the Run Test/Idle state. The DCM then returns to State 61 above, returning the TAP controller in the target chip back into the Run Test/Idle state.

In summary, it can be seen that the RAM in the target chip can be loaded or dumped through the JTAG interface. This is achieved by careful control of the TAP controllers in the clock control chip and the target chip: the DCM simultaneously controls the TAP controllers in both the clock control chip and the target chip. While the RAM Data Output register in the target chip is being extracted (or the RAM Data Input register is being loaded), the clock control chip is kept in the Run Test/Idle state. When the DCM has extracted or loaded a complete line, it pauses the target chip while it cycles the clock control chip to produce a one-shot system clock pulse, to select the next line of the RAM.

The advantage of this technique is that it provides diagnostic access to the very large amounts of data held in the RAMs in a fast and efficient way. Moreover, the technique does not require any significant amount of additional logic, assuming that the JTAG facilities are already present in the system.

Some possible modifications

It will be appreciated that many modifications may be made to the system described above without departing from the scope of the present invention. For example, interfaces other than the JTAG standard may be used.

We claim:

1. A data processing system comprising:
   (a) at least one processing module containing at least one block of memory, a plurality of internal registers, and a diagnostic interface allowing diagnostic access to said internal registers;
   (b) a clock module for distributing system clock signals to each said processing module, and having a diagnostic interface by way of which the operation of said clock module can be controlled to selectively generate a single-shot clock pulse; and
   (c) a diagnostic control unit connected to said diagnostic interfaces, said diagnostic control unit being operable to control said diagnostic interfaces to synchronise said single-shot clock pulse from the clock module with a diagnostic access in said processing module, to thereby effect line-by-line loading or dumping of said block of memory.

2. A system according to claim 1 wherein each diagnostic interface is a JTAG interface.

3. A system according to claim 1 wherein the clock module produces the single-shot clock pulse when its diagnostic interface passes through a predetermined state.

4. A system according to claim 1 wherein the processing module consists of a single integrated circuit chip.

5. A system according to claim 1 wherein the processing module comprises:
   (a) an addressing circuit for addressing said block of memory; and
   (b) means operative upon receipt of said single-shot clock pulse, for transferring a line of data in parallel between said block of memory and said internal registers, and also incrementing said addressing circuit.

6. A system according to claim 5 wherein the diagnostic interface in said processing module includes means for transferring a line of data serially between said internal registers and said diagnostic control unit.

7. A system according to claim 6 wherein the diagnostic control unit comprises a first counter for keeping track of the number of bits transferred between said internal registers and said diagnostic control unit, and a second counter for keeping track of the number of lines of the memory that have been accessed.

8. A data processing system comprising:
   (a) at least one processing module containing a memory and a plurality of internal registers;
   (b) a clock module for distributing system clock signals to each said processing module; and
   (c) a diagnostic control unit connected to each processing module and to the clock module by way of respective diagnostic interfaces, allowing diagnostic access to each said processing module and to said clock module;
   (d) wherein said clock module comprises means for producing a single-shot clock pulse under control of the diagnostic control unit;
   (e) wherein each processing module comprises means responsive to said single-shot clock pulse for transferring a line of data between a currently accessed location of said memory and said internal registers, and for causing a new location of said memory to be accessed.

9. A method of operating a data processing system comprising at least one processing module containing a memory and a plurality of internal registers, a clock module for distributing system clock signals to each said processing module, and a diagnostic control unit connected to each processing module and to the clock module by way of respective diagnostic interfaces, the method comprising the steps:
   (a) producing a series of single-shot clock pulses from said clock module under control of the diagnostic control unit, each single-shot clock pulse causing a line of data to be transferred between a currently accessed location of said memory and said internal registers, and causing a new location of said memory to be accessed; and
   (b) transferring said lines of data between said internal registers and said diagnostic control unit.

* * * * *